US009590162B2

(12) United States Patent
Fujii et al.

(10) Patent No.: US 9,590,162 B2
(45) Date of Patent: Mar. 7, 2017

(54) PIEZOELECTRIC VIBRATION COMPONENT AND PORTABLE TERMINAL

(71) Applicant: KYOCERA Corporation, Kyoto-shi, Kyoto (JP)

(72) Inventors: Yasuhito Fujii, Kirishima (JP); Satoru Iwasaki, Kirshima (JP); Harumi Hayashi, Kirishimi (JP); Kenji Yamakawa, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 39 days.

(21) Appl. No.: 14/388,479

(22) PCT Filed: Jan. 31, 2013

(86) PCT No.: PCT/JP2013/052154
§ 371 (c)(1),
(2) Date: Sep. 26, 2014

(87) PCT Pub. No.: WO2013/145845
PCT Pub. Date: Oct. 3, 2013

(65) Prior Publication Data
US 2015/0054382 A1 Feb. 26, 2015

(30) Foreign Application Priority Data
Mar. 26, 2012 (JP) .................. 2012-069575

(51) Int. Cl.
*H01L 41/04* (2006.01)
*H01L 41/083* (2006.01)
(Continued)

(52) U.S. Cl.
CPC ........ *H01L 41/042* (2013.01); *H01L 41/0475* (2013.01); *H01L 41/083* (2013.01);
(Continued)

(58) Field of Classification Search
CPC ............... H01L 41/083; H01L 41/0926; H01L 41/0973; H01L 41/0475
(Continued)

(56) References Cited

U.S. PATENT DOCUMENTS

2004/0080241 A1 4/2004 Ikegami
2006/0028095 A1* 2/2006 Maruyama .............. G06F 3/011
310/316.01
(Continued)

FOREIGN PATENT DOCUMENTS

JP 2002-232542 A 8/2002
JP 2007-159156 A 6/2007
(Continued)

OTHER PUBLICATIONS

International Search Report (Form PCT/ISA/210) dated Mar. 19, 2013 issued for PCT/JP2013/052154.

*Primary Examiner* — Derek Rosenau
(74) *Attorney, Agent, or Firm* — Volpe and Koenig, P.C.

(57) ABSTRACT

A piezoelectric vibration component and a portable terminal each include a piezoelectric vibration element 14 and a power supply line 51. The piezoelectric vibration element 14 includes at least: a layered structure 20 in which a plurality of internal electrodes and piezoelectric layers are layered in a first direction; and surface electrodes 33 and 31 electrically connected to the internal electrodes. The piezoelectric vibration element 14 bends and vibrates, and its amplitude changes in a second direction perpendicular to the first direction. The power supply line 51 includes at least: a conductive path 53 including a connection part 56 bonded to a surface electrode 33; and a conductive path 52 including a connection part 57 bonded to a surface electrode 31. The connection part 56 has a plurality of partial electrodes 56*a*
(Continued)

and 56b that extend in a third direction perpendicular to both the first direction and the second direction.

20 Claims, 9 Drawing Sheets (51) Int. Cl.
*H01L 41/047* (2006.01)
*H01L 41/09* (2006.01)
*H04R 7/04* (2006.01)
*H04R 17/00* (2006.01)
*H04M 1/02* (2006.01)
*H04R 1/10* (2006.01)

(52) U.S. Cl.
CPC ...... *H01L 41/0926* (2013.01); *H01L 41/0973* (2013.01); *H04M 1/026* (2013.01); *H04R 1/1075* (2013.01); *H04R 7/04* (2013.01); *H04R 17/00* (2013.01); *H04R 2499/11* (2013.01)

(58) Field of Classification Search
USPC .................. 310/328, 330–332, 365, 366
See application file for complete search history.

(56) References Cited

U.S. PATENT DOCUMENTS

| 2010/0165794 A1* | 7/2010 | Takahashi | H04R 17/00 367/189 |
| 2010/0213792 A1* | 8/2010 | Sakai | H01L 41/0471 310/323.16 |
| 2010/0237743 A1* | 9/2010 | Adachi | H01L 41/0471 310/323.02 |

FOREIGN PATENT DOCUMENTS

| JP | 3991364 B2 | 8/2007 |
| WO | WO 98/31095 A1 | 7/1998 |
| WO | WO 2005/004535 A1 | 1/2005 |
| WO | WO 2011/162002 A1 | 12/2011 |

* cited by examiner

PIEZOELECTRIC VIBRATION COMPONENT AND PORTABLE TERMINAL

TECHNICAL FIELD

The present invention relates to a piezoelectric vibration component and a portable terminal for which the piezoelectric vibration component is used.

BACKGROUND ART

Conventionally known piezoelectric vibration devices include a piezoelectric vibration element that bends and vibrates in its thickness direction (e.g., see Patent Literature 1).

CITATION LIST

Patent Literature

PTL 1: International Publication No. WO2005/004535

SUMMARY OF INVENTION

Technical Problem

A problem with such conventional piezoelectric vibration devices is that the bending of the piezoelectric vibration element may stress the bond between the piezoelectric vibration element and its power supply line, causing deterioration of the bond.

The present invention addresses conventionally technical problems as described above with an object of providing a piezoelectric vibration component that can reduce deterioration of the bond between a piezoelectric vibration element and a power supply line, and a portable terminal that includes the piezoelectric vibration component.

Solution to Problem

A piezoelectric vibration component of the present invention includes a piezoelectric vibration element and a power supply line. The piezoelectric vibration element includes at least: a layered structure in which a plurality of internal electrodes and a plurality of piezoelectric layers are layered in a first direction; and a first surface electrode and a second surface electrode which are electrically connected to the internal electrodes. The piezoelectric vibration element bends and vibrates in the first direction in response to an input of an electrical signal, and with this, the amplitude changes in a second direction perpendicular to the first direction. The power supply line includes at least: a first conductive path that has an end at which a first connection part is bonded to the first surface electrode; and a second conductive path that has an end at which a second connection part is bonded to the second surface electrode. The layered structure has a first section at its center in the second direction, and the plurality of internal electrodes and a plurality of piezoelectric layers are arranged alternately within the first section. The first surface electrode is disposed on a first surface that is one surface of the layered structure in the first direction, and at least partially positioned within the first section on the first surface. The first connection part of the first conductive path is bonded to the first surface electrode within the first section. The first connection part includes a plurality of partial electrodes that extend in a third direction perpendicular to both the first direction and the second direction.

A portable terminal of the present invention includes at least the above piezoelectric vibration component, an electronic circuit, a display, and a casing. The piezoelectric vibration component is mounted on the display or a cover of the display.

Advantageous Effects of Invention

According to the present invention, it is possible to obtain a piezoelectric vibration component that reduces deterioration of the bond between a piezoelectric vibration element and a power supply line. Moreover, according to the present invention, it is possible to obtain a highly reliable portable terminal.

BRIEF DESCRIPTION OF DRAWINGS

FIGS. 4(*a*) to 4(*d*) are explanatory plan views of the structure of the piezoelectric vibration element.

DESCRIPTION OF EMBODIMENTS

A piezoelectric vibration component and a portable terminal of the present invention will be described below in detail with reference to the accompanying drawings.

First Example of Embodiment

Figure 1:
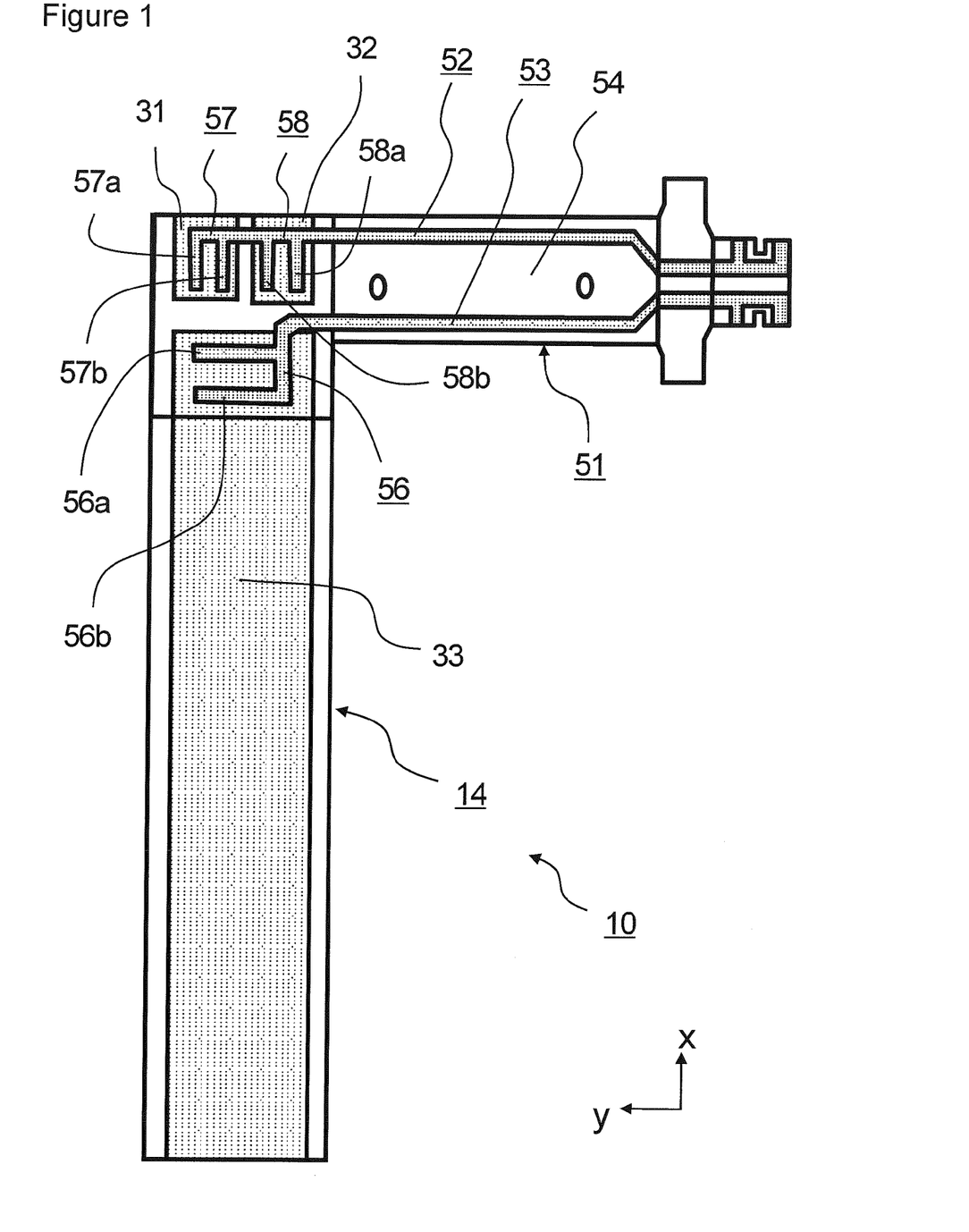
FIG. 1 is a schematic plan view illustrating a shape of a piezoelectric vibration component in a first example of an embodiment of the present invention.
Figure 2:
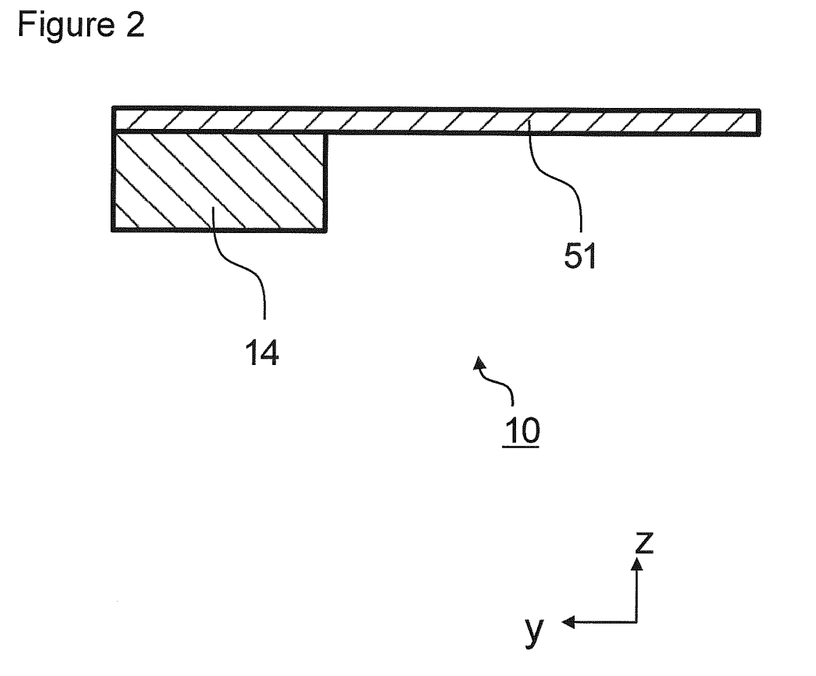
FIG. 2 is a schematic sectional view of the piezoelectric vibration component in FIG. 1.
Figure 3:
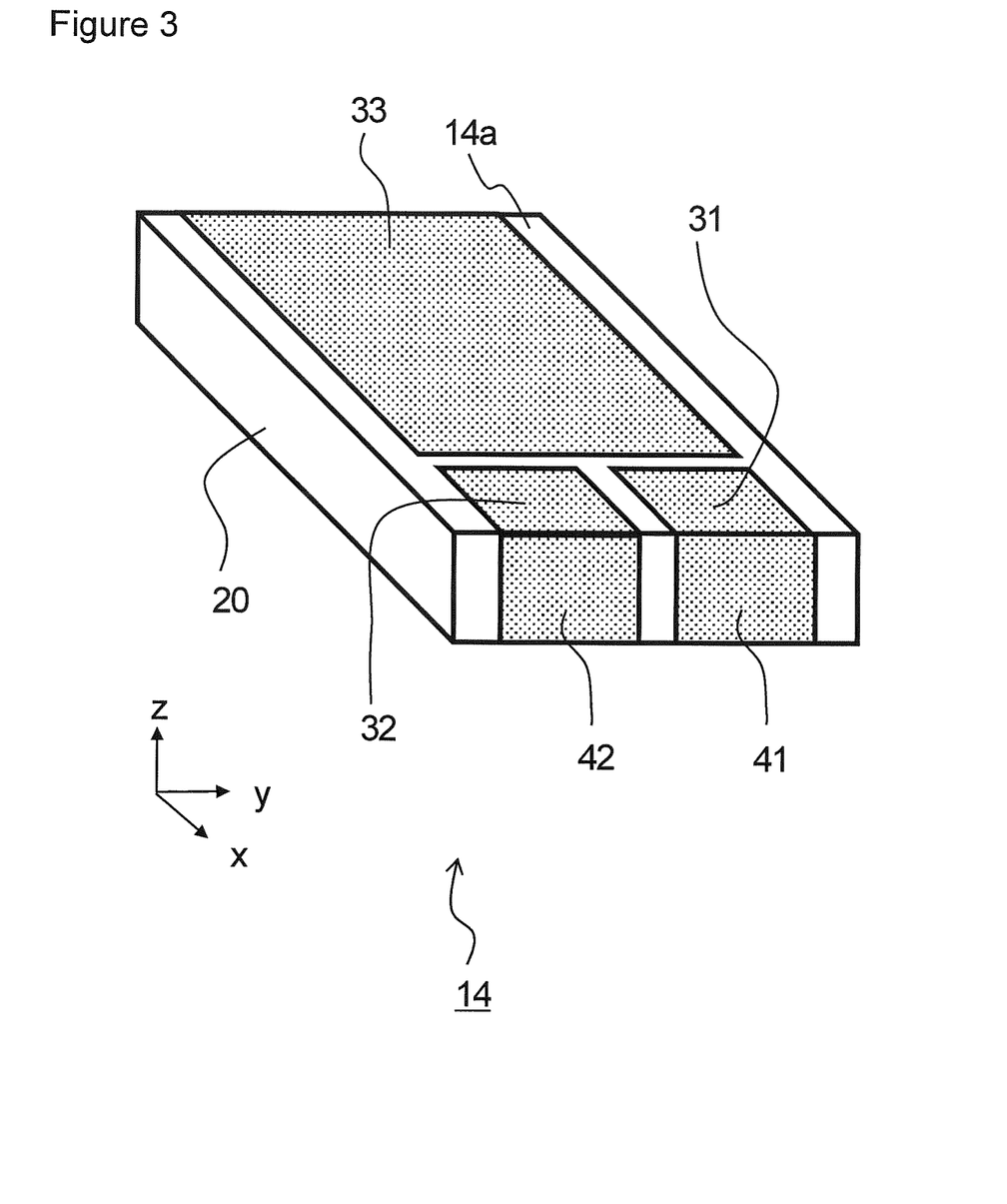
FIG. 3 is a schematic, perspective view illustrating a structure of the piezoelectric vibration element.
Figure 5:
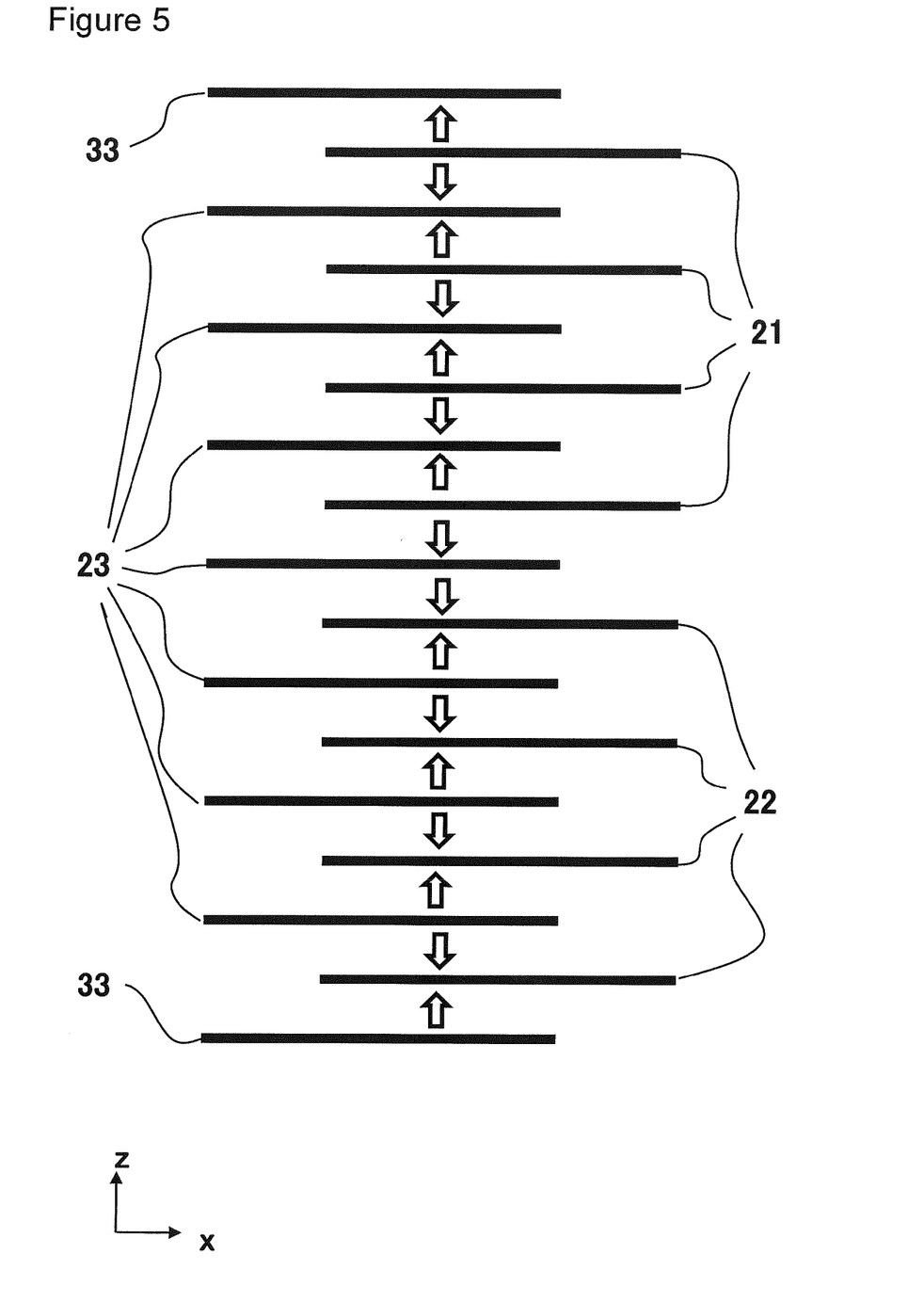
FIG. 5 is an explanatory view of the structure of the piezoelectric vibration element.
Figure 6:
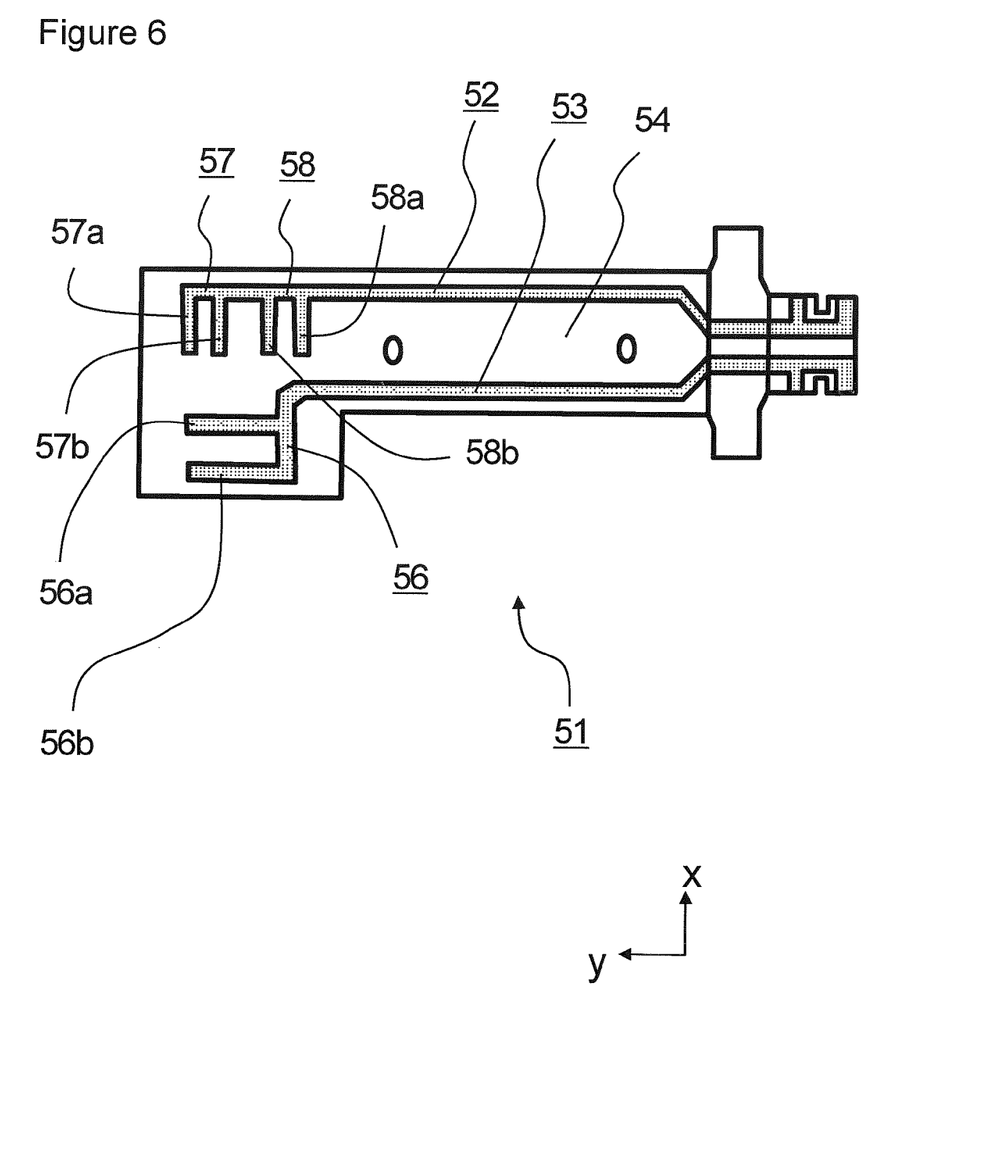
FIG. 6 is a schematic plan view illustrating a structure of the power supply line.

FIG. 1 schematically illustrates a planar shape of a piezoelectric vibration component 10, which is a first example of an embodiment of the present invention. FIG. 2 schematically illustrates the cross section of the piezoelectric vibration component 10 in FIG. 1. FIG. 3 schematically illustrates a structure of a piezoelectric vibration element 14 in FIG. 1 in perspective. FIGS. 4(*a*) to 4(*d*) are used to explain a planar structure of the piezoelectric vibration element 14 in FIG. 1. FIG. 5 is used to explain the structure of the piezoelectric vibration element 14 in FIG. 1. FIG. 6 schematically illustrates a planar structure of a power supply line 51 in FIG. 1. In FIGS. 1 and 6, a protective member 54 in the power supply line 51 is illustrated in a see-through manner for a better understanding of the structure. In FIG. 2, detailed structures of the piezoelectric vibration element 14 and the power supply line 51 are not illustrated. The piezoelectric vibration component 10 in this example is provided with the piezoelectric vibration element 14 and the power supply line 51, as illustrated in FIGS. 1 and 2.

As illustrated in FIG. 3, the piezoelectric vibration element 14 has a rectangular parallelepiped shape that extends in a second direction (the x axial direction in the drawings). The piezoelectric vibration element 14 includes a layered structure 20, surface electrodes 31, 32 and 33, connection electrodes 41 and 42, and a third connection electrode (not illustrated).

As illustrated in FIGS. 4 and 5, the layered structure 20 has a configuration in which a plurality of polarized piezoelectric layers 24 and a plurality of internal electrodes 21, 22 and 23 are layered in a first direction (the z axial direction in the drawings), or in the thickness direction of the piezoelectric vibration element 14.

Figure 4A:
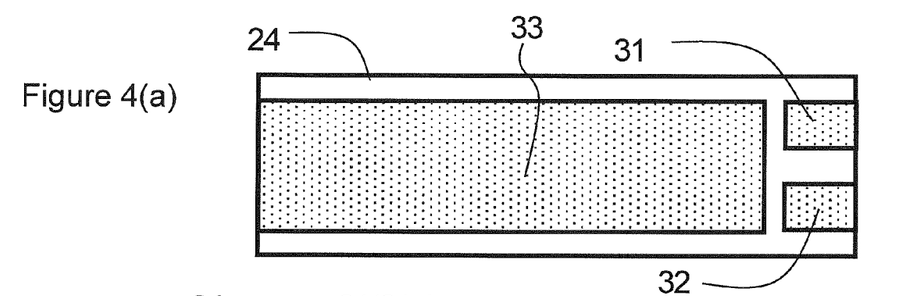

FIGS. 4(a) to 4(d) schematically illustrate, in a planar view, the surface electrodes 31, 32 and 33 and the internal electrodes 21, 22 and 23 in the piezoelectric vibration element 14. As illustrated in FIG. 4(a), the surface electrodes 31, 32 and 33 are disposed on both principal surfaces of the layered structure 20 (both surfaces in the first direction (the z axial direction in the drawings)). The plurality of internal electrodes 21, 22 and 23 are disposed inside the layered structure 20.

Figure 4B:
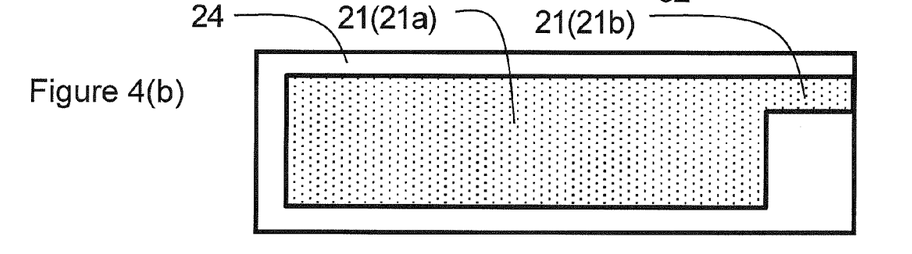

As illustrated in FIG. 4(b), each internal electrode 21 has a structure in which a main part 21a is formed on a substantially entire surface of a corresponding piezoelectric layer 24 with clearances from the side surfaces of the layered structure 20 and one edge of the main part 21a in the lengthwise direction is connected to a rectangular lead part 21b, an edge of which is exposed from a side surface of the layered structure 20.

Figure 4C:
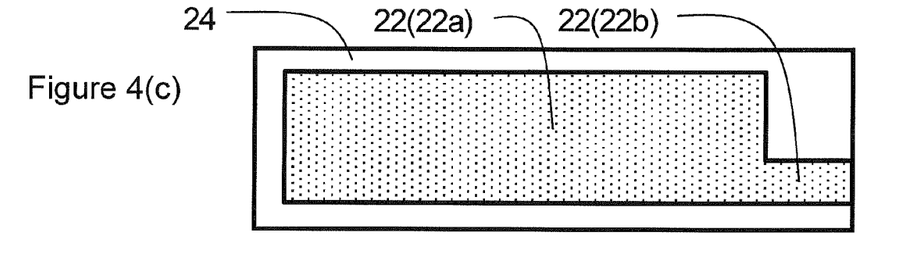

As illustrated in FIG. 4(c), each internal electrode 22 has a structure in which a main part 22a is formed on a substantially entire surface of a corresponding piezoelectric layer 24 with clearances from the side surfaces of the structure 20 and one edge of the main part 22a in the lengthwise direction is connected to a rectangular lead part 22b, an edge of which is exposed from a side surface of the layered structure 20.

Figure 4D:
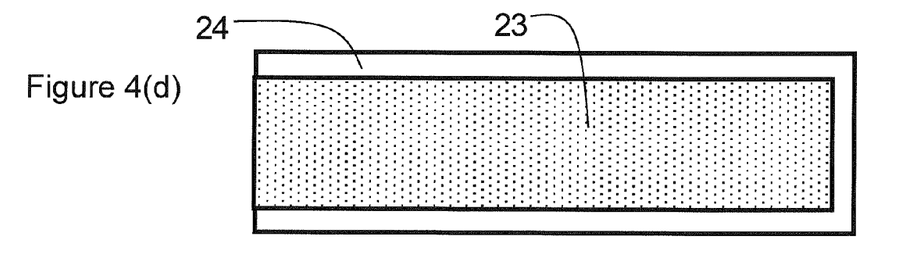

As illustrated in FIG. 4(d), each internal electrode 23 is formed on a substantially entire surface of a corresponding piezoelectric layer 24 into a rectangular shape. In addition, only one edge of each internal electrode 23 in the longwise direction is exposed from a side surface of the layered structure 20, whereas the other edges thereof are formed with clearances from the other side surfaces of the layered structure 20. The lead parts 21b and 22b are arranged with a clearance therebetween in the width direction of the layered structure 20, so as not to overlap each other in the layered direction of the layered structure 20.

As illustrated in FIG. 4(a), the surface electrode 33 has a rectangular shape that extends in the second direction (the x axial direction in the drawings). In addition, only one edge of the surface electrode 33 in the lengthwise direction is exposed from a side surface of the layered structure 20, whereas the other sides thereof are formed with clearances from the other side surfaces of the layered structure 20.

The surface electrodes 31 and 32 are disposed between the surface electrode 33 and one edge of the layered structure 20 in the lengthwise direction. Of each of the rectangular surface electrodes 31 and 32, one edge in the lengthwise direction is exposed from one side surface of the layered structure 20 in the lengthwise direction.

The layered structure 20 has a configuration in which the internal electrodes 21, 22 and 23 and the piezoelectric layers 24 are layered alternately on top of one another in the first direction (the z axial direction in the drawings). FIG. 5 schematically illustrates the arrangement of the surface electrodes 33 and the internal electrodes 21, 22 and 23 in the layered direction of the layered structure 20, and polarized directions of the piezoelectric layers 24 disposed among the surface electrode 33 and the internal electrodes 21, 22 and 23. As illustrated in FIG. 5, the internal electrodes 21 or 22 and the internal electrodes 23 are arranged alternately in the first direction (the z axial direction in the drawings). More specifically, the internal electrodes 21 and 23 are arranged alternately on one side in the first direction (the side in the +z direction in the drawings), whereas the internal electrodes 22 and 23 are arranged alternately on the other side (the side in the −z direction in the drawings).

The lead parts 21b in the plurality of internal electrodes 21 which are exposed from the side surface of the layered structure 20 are interconnected on one side in the second direction (the side in the +x direction) by the connection electrode 41. Furthermore, the plurality of internal electrodes 21 are connected to the surface electrode 31 disposed on both principal surfaces of the layered structure 20 via the connection electrode 41.

The lead parts 22b in the plurality of internal electrodes 22 which are exposed from the side surface of the layered structure 20 are interconnected on one side in the second direction (the side in the +x direction) by the connection electrode 42. Furthermore, the plurality of internal electrodes 22 are connected to the surface electrode 32 disposed on both principal surfaces of the layered structure 20 via the connection electrode 42.

The plurality of internal electrodes 23 exposed from the side surface of the layered structure 20 are interconnected on the other side in the second direction (the side in the −x direction) by the third connection electrode (not illustrated). Furthermore, the plurality of internal electrodes 23 are connected to the surface electrode 33 disposed on both principal surfaces of the layered structure 20 via the third connection electrode (not illustrated). The surface electrodes 31, 32 and 33 structured above function as terminal electrodes of the piezoelectric vibration element 14.

The piezoelectric layers 24 disposed among the internal electrodes 21, 22 and 23 are polarized in directions indicated by the arrows in FIG. 5. This polarization can be carried out by, for example, applying DC voltages to the surface electrodes 31, 32 and 33 such that the surface electrode 31 has a higher electrical potential than the surface electrode 33 and the surface electrode 32 has a lower electrical potential than the surface electrode 33. When the piezoelectric vibration element 14 vibrates, AC voltages are applied to the surface electrodes 31, 32 and 33 such that the electrical potentials of the surface electrodes 31 and 32 are the same as each other but differ from that of the surface electrode 33. As a result, with respect to a direction of the electric field applied at any given moment, one half part and the other half part of the piezoelectric vibration element 14 in its thickness direction (the z axial direction in the drawings) are polarized in directions opposite to each other.

Specifically, when an electric field is applied to the piezoelectric vibration element 14 at any given moment, the one half part of the piezoelectric vibration element 14 in its thickness direction (the z axial direction in the drawings) stretches along the lengthwise direction of the piezoelectric vibration element 14 (the x axial direction in the drawings), but the other half part thereof shrinks along the lengthwise direction. The piezoelectric vibration element 14 thereby bends and vibrates in the first direction (the z axial direction in the drawings) in response to the application of electrical signals. With this, the amplitude changes in the second direction (the x axial direction in the drawings) perpendicular to the first direction. As described above, the piezoelectric vibration element 14 is formed of a piezoelectric body having a bimorph structure (piezoelectric bimorph element).

As illustrated in FIG. 6, the power supply line 51 includes conductive paths 52 and 53 and the protective member 54. The power supply line 51 has a function of transmitting electrical signals to the piezoelectric vibration element 14 via the conductive paths 52 and 53. The conductive paths 52 and 53 are each formed of an electrically conductive body. For example, each of the conductive paths 52 and 53 can be made of a highly conductive metal such as copper; however any other metal or conductive body may also be used.

The conductive path 52 has a connection part 57 at its end. The connection part 57 is bonded to the surface electrode 31 via a non-illustrated conductive bond member. In addition, the conductive path 52 has a connection part 58. The connection part 58 is bonded to the surface electrode 32 via a non-illustrated conductive bond member. The connection part 57 has a plurality of partial electrodes 57a and 57b that extend in a second direction (the x axial direction in the drawings) perpendicular to both the first direction and third directions (the z and y axial directions, respectively, in the drawings). The connection part 58 has a plurality of partial electrodes 58a and 58b that extend in the third direction (the y axial direction in the drawings). The partial electrodes 57a and 57b are arranged with a clearance therebetween in the third direction (the y axial direction in the drawings); the partial electrodes 58a and 58b are arranged with a clearance therebetween in the third direction.

The conductive path 53 has a connection part 56 at its end. The connection part 56 is bonded to the surface electrode 33 via a non-illustrated conductive bond member. The connection part 56 is positioned closer to the center (the side in the −x direction in the drawings) of the piezoelectric vibration element 14 in the second direction than both the connection parts 57 and 58, and disposed with a clearance from both the connection parts 57 and 58. The connection part 56 has an end at which a plurality of partial electrodes 56a and 56b extend in the third direction (the y axial direction in the drawings). The partial electrodes 56a and 56b are arranged with a clearance therebetween in the second direction (the x axial direction in the drawings).

For example, a solder, an electrically conductive adhesive, an anisotropic conductive film, or the like can be used as the conductive bond members that bond the surface electrodes 31, 32 and 33 in the piezoelectric vibration element 14 to the connection parts 57, 58 and 56, respectively, in the power supply line 51.

The protective member 54 is formed so as to cover the conductive paths 52 and 53 except for their both ends. The protective member 54 can be made of a resin material such as polyimide; however any other resin material or insulating body may also be used. The power supply line 51 configured above can easily be fabricated using, for example, a known flexible printed circuit board (FPC).

As described above, the piezoelectric vibration component 10 in this example includes at least a piezoelectric vibration element 14 and a power supply line 51. The piezoelectric vibration element 14 includes at least: a layered structure 20 in which a plurality of internal electrodes 21, 22 and 23 and piezoelectric layers 24 are layered on top of one another in the first direction (the z axial direction in the drawings); a first surface electrode (surface electrode 33) electrically connected to the internal electrodes 23; and a second surface electrode (surface electrode 31) electrically connected to the internal electrodes 21. The piezoelectric vibration element 14 bends and vibrates in the first direction (the z axial direction in the drawings) in response to an input of electrical signals. With this, the amplitude changes in the second direction (the x axial direction in the drawings) perpendicular to the first direction. The power supply line 51 includes at least a first conductive path (conductive path 53) and a second conductive path (conductive path 52). The first conductive path (conductive path 53) has an end at which a first connection part (connection part 56) is bonded to the first surface electrode (surface electrode 33). The second conductive path (conductive path 52) has an end at which a second connection part (connection part 57) is bonded to the second surface electrode (surface electrode 31).

The layered structure 20 has a first section at its center in the second direction (the x axial direction in the drawings). In this first section, the plurality of internal electrodes 21, 22 and 23 and the piezoelectric layers 24 are arranged alternately. The first surface electrode (surface electrode 33) is disposed on at least a first surface 14a that is one surface of the layered structure 20 in the first direction (the z axial direction in the drawings), and at least partially positioned within the first section on the first surface 14a. In the first section, the first connection part (connection part 56) of the first conductive path (conductive path 53) is bonded to the first surface electrode (surface electrode 33). Furthermore, the first connection part (connection part 56) includes a plurality of partial electrode 56a and 56b that extend in the third direction (the y axial direction in the drawings) perpendicular to both the first direction and the second direction (the z and x axial directions, respectively, in the drawings). In the first section, the internal electrodes 21 and 22 connected to the same electrical potential face the internal electrodes 23 connected to a different electrical potential with the respective piezoelectric layers 24 therebetween.

Because of the above configuration, the piezoelectric vibration component 10 in this example can provide both an adequate contact area between the connection part 56 and the piezoelectric vibration element 14 and the plurality of partial electrodes 56a and 56b downsized in the second direction (the x axial direction in the drawing, or a direction in which the amplitude of the bending vibration of the piezoelectric vibration element 14 changes). More specifically, the piezoelectric vibration component 10 can assure the strong bond between the connection part 56 and the piezoelectric vibration element 14, and relieve stress on this bond which would be applied by the piezoelectric vibration element 14 bent and vibrated with its amplitude changing in the second direction (the x axial direction in the drawings). Consequently, it is possible to obtain a piezoelectric vibration component that reduces deterioration of the bond between the piezoelectric vibration element 14 and the power supply line 51.

In the piezoelectric vibration component 10 in this example, the layered structure 20 has a second section therein on one side (the side in the +x direction in the drawings) in the second direction (the x axial direction in the drawings) of the layered structure 20. In this second section, the plurality of internal electrodes 21, 22 and 23 and piezoelectric layers 24 are not arranged alternately. In addition, the layered structure 20 has a third section therein on the other side (the side in the −x direction in the drawings) in the second direction (the x axial direction in the drawings) of the layered structure 20. In this third section, the plurality of internal electrodes 21, 22 and 23 and piezoelectric layers 24 are not arranged alternately. The second section occupies a larger region than the third section. The second surface electrode (surface electrode 31) is disposed on at least the first surface 14a of the layered structure 20, and at least partially positioned within the second section on the first surface 14a. In each of the second and third sections, the internal electrodes 21 and 22 connected to the same electrical potential do not face the internal electrodes 23 connected to a different electrical potential with the respective piezoelectric layers 24 therebetween.

Because of the above configuration, the surface electrode 31 is disposed within the part of the piezoelectric vibration component 10 in this example which is not distorted greatly by the bent and vibrated piezoelectric vibration element 14. This can relieve stress on the bond between the surface electrode 31 and the connection part 57, thus obtaining a piezoelectric vibration component that reduces deterioration of the bond between the piezoelectric vibration element 14 and the power supply line 51.

In the piezoelectric vibration component 10 in this example, the power supply line 51 sticks out from the piezoelectric vibration element 14 in a direction (more specifically, the y axial direction in the drawings) along which a component of the third direction (the y axial direction in the drawings) is present. Furthermore, the second connection part (connection part 57) has a plurality of partial electrodes 57a and 57b extending in the second direction (the x axial direction in the drawings). This can provide both the plurality of partial electrodes 57a and 57b downsized in the y axial direction in the drawings and a wide bond area between the connection part 57 and the surface electrode 31. Therefore, even when vibrations of the piezoelectric vibration element 14 cause the power supply line 51 to bend and vibrate and its amplitude changes in the y axial direction in the drawings, it is possible to obtain a piezoelectric vibration component that reduces deterioration of the bond between the connection part 57 and the surface electrode 31.

The piezoelectric vibration component 10 in this example further includes a third surface electrode (surface electrode 32). The third surface electrode (surface electrode 32) is disposed on at least the first surface 14a of the layered structure 20, and at least partially positioned within the second section on the first surface 14a. In addition, the third surface electrode is connected to the internal electrodes 22. The second conductive path (conductive path 52) further has a third connection part (connection part 58) connected to the third surface electrode (surface electrode 32). The third connection part (connection part 58) has a plurality of partial electrodes 58a and 58b that extend in the second direction (the x axial direction in the drawings).

Because of the above configuration, the piezoelectric vibration component 10 in this example can provide both the plurality of partial electrodes 58a and 58b downsized in the y axial direction in the drawings and a wide bond area between the connection part 58 and the surface electrode 32. Therefore, even when vibrations of the piezoelectric vibration element 14 cause the power supply line 51 to bend and vibrate and its amplitude changes in the y axial direction in the drawings, it is possible to obtain a piezoelectric vibration component that reduces deterioration of the bond between the connection part 58 and the surface electrode 32.

In the piezoelectric vibration component 10 in this example, the layered structure 20 can be, for example, approximately 18 mm to 28 mm long, 1 mm to 6 mm wide, and 0.2 mm to 1.0 mm thick. The main part 21a of each internal electrode 21 and the main part 22a of each internal electrode 22 can be, for example, approximately 17 mm to 25 mm long. Each internal electrode 23 and the surface electrode 33 can be, for example, approximately 19 mm to 27 mm and 17 mm to 23 mm long, respectively. The main part 21a of each internal electrode 21, the main part 22a of each internal electrode 22, each internal electrode 23, and the surface electrode 31 can be, for example, approximately 1 mm to 5 mm wide. The surface electrodes 31 and 32 can be, for example, approximately 1 mm to 3 mm long. The surface electrodes 31 and 32 can be, for example, approximately 0.5 mm to 1.5 mm wide.

The piezoelectric layers 24 forming the layered structure 20 can be made using, as appropriate, for example, a lead-free piezoelectric material such as lead zirconate (PZ), lead zirconate titanate (PZT), a Bi-layered compound or a tungsten bronze structure compound; however any other piezoelectric material may also be used. Each piezoelectric layer 24 can be set to, for example, approximately 0.01 mm to 0.1 mm thick. Each of the internal electrodes 21, 22 and 23 forming the piezoelectric vibration element 14 can be made using, as appropriate, a material containing a metal element such as silver or an alloy of silver and palladium, a ceramic element, or a glass element; however any other known metal material may also be used.

The piezoelectric vibration element 14 configured above can be fabricated, for example, by the following method. First, a binder, a dispersant, a plasticizer and a solvent are added to a piezoelectric material powder, and the mixture is stirred to manufacture slurry. Then, the resultant slurry is molded into a sheet shape to manufacture a green sheet. Next, a conductive paste is printed on the green sheet to form electrode patterns that will be used as internal electrodes 21, 22 and 23. Such green sheets on which the electric patterns are printed are stacked on top of one another. Then, the stacked green sheets are pressed by a press apparatus to manufacture a molded layered body. After that, the molded layered body is subjected to cleaning and firing treatments, and cut into a preset size to obtain a layered structure. Next, a conductive paste used to form the surface electrodes 31, 32 and 33, the connection electrodes 41 and 42, and the third connection electrode (not illustrated) is printed on the layered structure. Then, the layered structure is fired at a predetermined temperature, after which a DC voltage is applied to the layered structure via the surface electrodes 31, 32 and 33, so that the piezoelectric layers 24 are polarized. In this way, the piezoelectric vibration element 14 can be obtained.

Second Example of Embodiment

Figure 7:
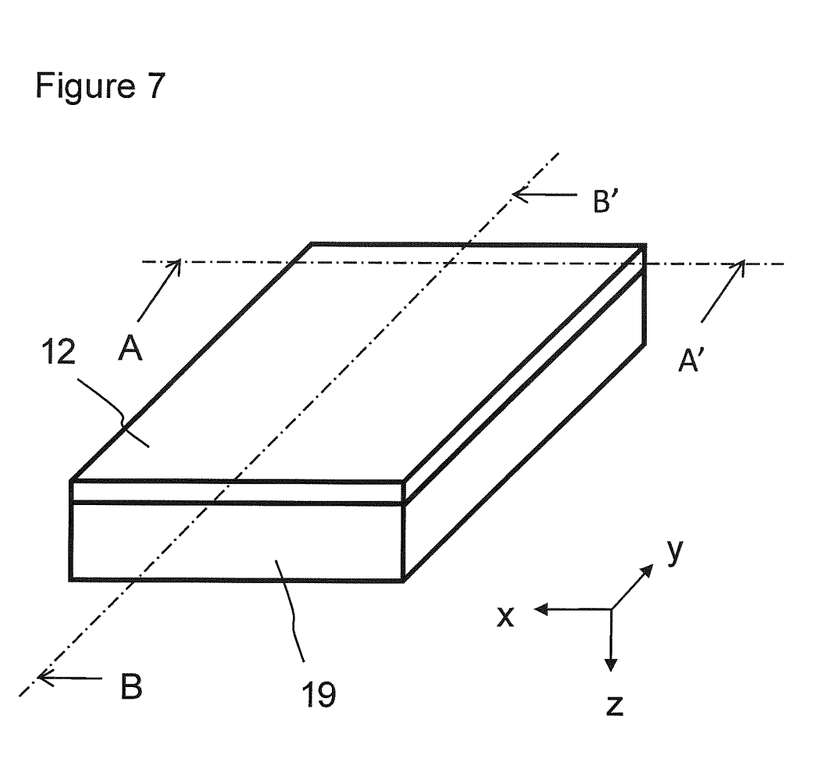
FIG. 7 is a schematic, perspective view illustrating a portable terminal in a second example of an embodiment of the present invention.
Figure 8:
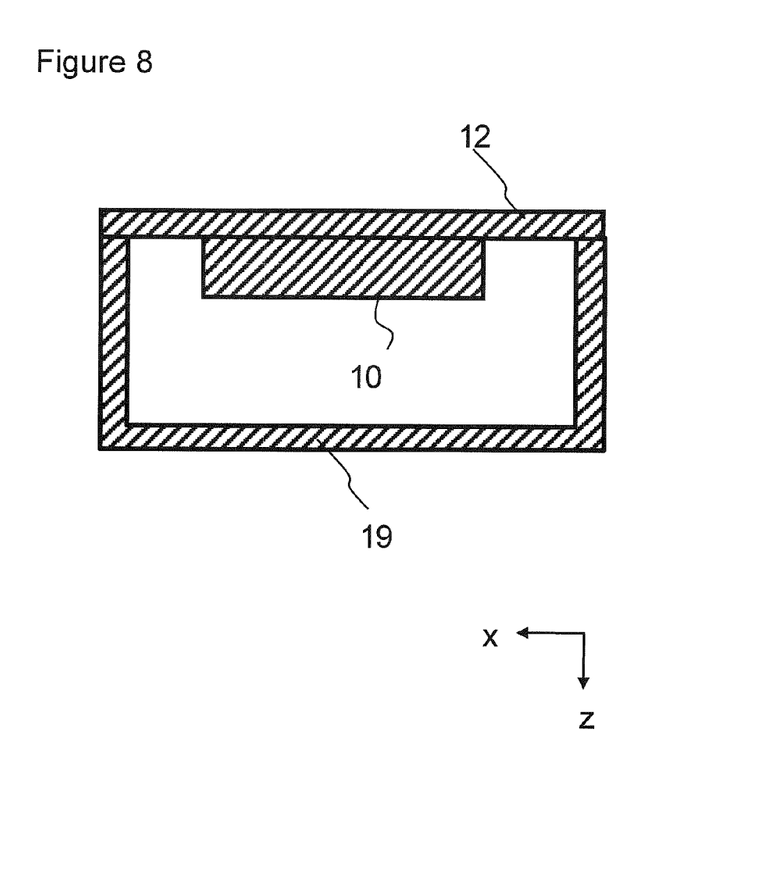
FIG. 8 is a sectional view taken along the line A-A' in FIG. 7.
Figure 9:
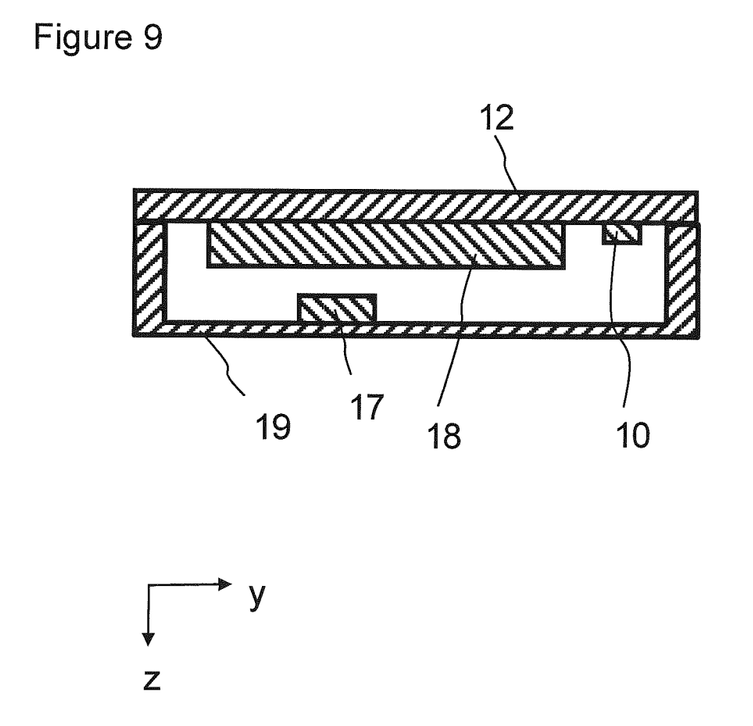
FIG. 9 is a sectional view taken along the line B-B' in FIG. 7.

FIG. 7 schematically illustrates a portable terminal in perspective, which is a second example of an embodiment of the present invention. FIG. 8 illustrates a cross section taken along the line A-A' in FIG. 7. FIG. 9 illustrates a cross section taken along the line B-B' in FIG. 7. In FIGS. 8 and 9, a detailed structure of the piezoelectric vibration component 10 is not illustrated. Thereinafter, differences between this example and the above first example will be described; the same constituent elements are given the same reference characters and will not be described.

As illustrated in FIGS. 7 to 9, the portable terminal in this example includes a casing 19, a display 18, a display cover 12, a piezoelectric vibration component 10, and an electronic circuit 17.

The casing 19 has a box shape with one surface opened. The casing 19 can be made using a highly stiff, elastic material, such as a synthetic resin, as appropriate; however any other material such as a metal may also be used.

The display 18 is a display device that has a function of displaying image information, and can be, for example, a known display such as a liquid crystal display, a plasma display, or an organic EL display, as appropriate. In addition, the display 18 may be equipped with an input device such as a touch panel.

The display cover 12 has a rectangular sheet shape, and is integrated with the display 18. The display cover 12 is positioned outside the display 18, and fulfills a function of protecting the display 18. The casing 19 is bonded to only the periphery of one principal surface (the principal surface in the +z direction in drawings) of the display cover 12 via a not-illustrated joint member. Specifically, the display cover 12 is attached to the casing 19 in such a way that it can vibrate. The display cover 12 can be made using a highly stiff, elastic material, such as an acrylic resin or glass, as appropriate. The display cover 12 is set to, for example, approximately 0.4 mm to 1.5 mm thick. In addition, the display cover 12 may be equipped with an input device such as a touch panel.

The piezoelectric vibration component 10 in the first example in FIG. 1 is mounted on a part of one principal surface (the principal surface in the +z direction in the drawings) of the display cover 12. Specifically, the other surface (the surface in the −z direction in the drawings) of the piezoelectric vibration element 14 in the piezoelectric vibration component 10 in the first direction is bonded to the principal surface (the surface in the +z direction in the drawings) of the display cover 12 via a not-illustrated joint member.

The electronic circuit 17 includes a circuit which processes image information that will appear on the display 18, a circuit that processes audio information transmitted by the vibrated piezoelectric vibration component 10, and a communication circuit. The electronic circuit 17 may include one or more of the above circuits or all of these. Alternatively, the electronic circuit 17 may have another function. In addition, the electronic circuit 17 may include a plurality of electronic circuits. The electronic circuit 17 is connected to the piezoelectric vibration element 14 via the power supply line 51.

For example, a double-stick tape in which a pressure-sensitive adhesive is applied to both surfaces of a base material made of a nonwoven fabric cloth or the like or any given type of elastic adhesive can be used, as appropriate, for each of the joint members used to bond the display cover 12 to the casing 19 and the piezoelectric vibration element 14.

The portable terminal in this example, configured above, vibrates the display cover 12 and the display 18 by vibrating the piezoelectric vibration component 10, thereby being able to emit sound. This sound enables audio information to be transmitted to a person. Alternatively, the display cover 12 or the casing 19 may be brought into direct or indirect contact with a human body part, such as an ear, and the portable terminal may transmit audio information by transferring vibrations from the display cover 12 or the casing 19 to the human body part. In this case, it is possible to obtain a portable terminal that can transmit audio information, for example, even in noisy surroundings.

According to this example, it is possible to obtain a highly reliable portable terminal, because it uses the piezoelectric vibration component 10 that reduces deterioration of the bond between the piezoelectric vibration element 14 and the power supply line 51.

The portable terminal in this example may be used in various applications, provided it has a function of generating a vibration or sound by vibrating a piezoelectric vibration element. Exemplary applications can be assumed to be personal computers, portable phones, portable TVs, tablet terminals, earphones, compact speakers, and other electronic devices.

(Modifications)

The present invention is not limited to the examples described above, and can be modified or varied in various ways within the split of the present invention.

In the examples described above, for example, each of the connection parts 56, 57 and 58 has two partial electrodes; however the present invention is not limited to this structure. Alternatively, each of the connection parts 56, 57 and 58 may have three or more partial electrodes.

In the examples described above, each of the connection parts 57 and 58 has a plurality of partial electrodes extending in the x axial direction in the drawings; however the present invention is not limited to this structure. Alternatively, for example, at least one of the connection parts 57 and 58 may have a plurality of partial electrodes extending in the y axial direction in the drawings. This structure is especially effective when the power supply line 51 sticks out from the piezoelectric vibration element 14 in the x axial direction in the drawings. Alternatively, both the connection parts 57 and 58 may have no partial electrodes.

In the examples described above, the piezoelectric vibration element 14 employs a bimorph type; however there is no limitation on the type of the piezoelectric vibration element 14. Alternatively, for example, the piezoelectric vibration element 14 may employ a unimorph type. For example, a unimorph type of piezoelectric vibration element can be obtained by removing the internal electrodes 22, the surface electrode 32 and the connection electrode 42 from the piezoelectric vibration element 14 in FIGS. 3 to 5 and arranging the internal electrodes 23 only in the +z direction in the drawings. In this case, the connection part 58 is also unnecessary.

In the second example described above, the piezoelectric vibration component 10 is mounted on the display cover 12; however the present invention is not limited to this structure. Alternatively, for example, the piezoelectric vibration component 10 may be mounted on the display 18. In addition, the display cover 12 may not be provided. In this case, it is only necessary to bond the casing 19 to the periphery of the display 18.

REFERENCE SIGNS LIST

10: piezoelectric vibration component
12: display cover
14: piezoelectric vibration element
17: electronic circuit
18: display
19: casing
21, 22, 23: internal electrode
24: piezoelectric layer
31, 32, 33: surface electrode
51: power supply line
52, 53: conductive path
56, 57, 58: connection part
56*a*, 56*b*, 57*a*, 57*b*, 58*a*, 58*b*: partial electrode

The invention claimed is:
1. A piezoelectric vibration component comprising:
a piezoelectric vibration element including:
a layered structure in which a plurality of internal electrodes and a plurality of piezoelectric layers are layered; and a first surface electrode and a second surface electrode which are electrically connected to the internal electrodes, the piezoelectric vibration element having a dimension in a first direction, a dimension in a second direction perpendicular to the first direction, and a dimension in a third direction perpendicular to both the first direction and the second direction, the dimension in the second direction being larger than the dimension in the first direction and the dimension in the third direction, the plurality of internal electrodes and the plurality of piezoelectric layers being layered in the first direction, the piezoelectric vibration element bending and vibrating in the first direction in response to an input of an electrical signal, an amplitude of the vibration changing in the second direction; and a power supply line including:

a first conductive path including a first connection part bonded to the first surface electrode at an end of the first conductive path; and a second conductive path including a second connection part bonded to the second surface electrode at an end of the second conductive path, wherein the layered structure including a first section at its center in the second direction, the plurality of internal electrodes and the plurality of piezoelectric layers being arranged alternately within the first section, the first surface electrode and the second surface electrode being disposed on a first surface, the first surface being one end surface of the layered structure in the first direction, the first surface electrode being at least partially positioned within the first section on the first surface, the first connection part of the first conductive path being bonded to the first surface electrode within the first section, the first connection part including a plurality of partial electrodes extending in the third direction.

2. The piezoelectric vibration component according to claim 1, wherein the layered structure includes a second section and a third section at its respective sides in the second direction, the plurality of internal electrodes and the plurality of piezoelectric layers being not arranged alternately within both the second and third sections, the second section occupies a larger region than the third section, and the second surface electrode is disposed on the first surface of the layered structure, and at least partially positioned within the second section on the first surface.

3. The piezoelectric vibration component according to claim 2, wherein the power supply line sticks out from the piezoelectric vibration element in a direction along which a component of the third direction is present, and the second connection part includes a plurality of partial electrodes extending in the second direction.

4. The piezoelectric vibration component according to claim 3, further comprising a third surface electrode disposed on the first surface of the layered structure, the third surface electrode being at least partially positioned within the second section on the first surface, the third surface electrode being connected to the internal electrodes, wherein the second conductive path further includes a third connection part connected to the third surface electrode, and the third connection part includes a plurality of partial electrodes extending in the second direction.

5. A portable terminal comprising:

the piezoelectric vibration component recited in claim 1;
an electronic circuit;
a display; and
a casing, the piezoelectric vibration component being mounted on the display or a cover of the display.

6. A piezoelectric vibration component comprising:

a piezoelectric vibration element, the piezoelectric vibration element having a dimension in a first direction, a dimension in a second direction perpendicular to the first direction, and a dimension in a third direction perpendicular to both the first direction and the second direction, the dimension in the second direction being larger than the dimension in the first direction and the dimension in the third direction, the piezoelectric vibration element bending and vibrating in the first direction, an amplitude of the vibration changing in the second direction, the piezoelectric vibration element including a first surface electrode; and a power supply line including a plurality of partial electrodes electrically connected to the piezoelectric vibration element; wherein the plurality of partial electrodes extend in the third direction, the plurality of partial electrodes being bonded to the first surface electrode within a first section at the center of the piezoelectric vibration element in the second direction.

7. The piezoelectric vibration component according to claim 6, wherein the plurality of partial electrodes are bonded to the first section at the center of the piezoelectric vibration element in the second direction at an end.

8. The piezoelectric vibration component according to claim 6, wherein the first surface electrode faces the first direction.

9. The piezoelectric vibration component according to claim 8, wherein the piezoelectric vibration element includes a plurality of internal electrodes electrically connected to the first surface electrode and a plurality of piezoelectric layers, wherein the plurality of internal electrodes and the plurality of piezoelectric layers are layered in the first direction within the first section.

10. The piezoelectric vibration component according to claim 9, wherein the piezoelectric vibration element includes a second surface electrode electrically connected to the plurality of internal electrodes.

11. The piezoelectric vibration component according to claim 10, wherein the piezoelectric vibration element includes a second section at side in the second direction, the second surface electrode is disposed at least partially positioned within the second section.

12. The piezoelectric vibration component according to claim 11, wherein the plurality of internal electrodes and the plurality of piezoelectric layer are not arranged alternately within the second section.

13. The piezoelectric vibration component according to claim 10, wherein the power supply line includes a second plurality of partial electrodes bonded to the second surface electrode.

14. The piezoelectric vibration component according to claim 13, wherein
the second plurality of partial electrodes bonded to the second surface electrode each extend in the second direction.

15. The piezoelectric vibration component according to claim 6, wherein
the power supply line extends from the piezoelectric vibration element in the third direction.

16. The piezoelectric vibration component according to claim 6, wherein
the power supply line is a flexible printed circuit board.

17. The piezoelectric vibration component according to claim 6, wherein
the piezoelectric vibration element is a bimorph type.

18. The piezoelectric vibration component according to claim 6, wherein
the piezoelectric vibration element is a unimorph type.

19. A portable terminal comprising:
a casing;
an electronic circuit disposed in the casing;
a display disposed in the casing and connected to the electronic circuit;
a display cover positioned outside the display; and
the piezoelectric vibration component recited in claim 6 and disposed on the display cover.

20. The portable terminal according to claim 19, wherein
the display cover emits a sound processed in the electronic circuit.

* * * * *